United States Patent
Shimotoyodome

(10) Patent No.: US 7,483,931 B2
(45) Date of Patent: Jan. 27, 2009

(54) SIGNAL GENERATOR USING IIR TYPE DIGITAL FILTER; AND METHOD OF GENERATING, SUPPLYING, AND STOPPING ITS OUTPUT SIGNAL

(75) Inventor: Tsutomu Shimotoyodome, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 795 days.

(21) Appl. No.: 11/045,044

(22) Filed: Jan. 31, 2005

(65) Prior Publication Data

US 2005/0169360 A1 Aug. 4, 2005

(30) Foreign Application Priority Data

Jan. 30, 2004 (JP) ............... 2004-022723

(51) Int. Cl.
*G06F 17/10* (2006.01)
(52) U.S. Cl. ....................................... 708/320
(58) Field of Classification Search ................. 708/320
See application file for complete search history.

(56) References Cited

U.S. PATENT DOCUMENTS

| | | | |
|---|---|---|---|
| 4,633,046 A | 12/1986 | Kitayama et al. | |
| 4,658,255 A | 4/1987 | Nakamura et al. | |
| 5,301,135 A * | 4/1994 | Principe et al. | 708/320 |
| 5,502,663 A | 3/1996 | Lyon | |
| 5,602,929 A | 2/1997 | Popovich | |
| 5,654,765 A | 8/1997 | Kim | |
| 6,256,383 B1 | 7/2001 | Chen | |
| 6,285,718 B1 * | 9/2001 | Reuven | 375/257 |
| 6,862,326 B1 | 3/2005 | Eran et al. | |
| 6,976,044 B1 * | 12/2005 | Kilani | 708/320 |
| 6,980,592 B1 | 12/2005 | Rambaud et al. | |
| 7,020,297 B2 | 3/2006 | Fang et al. | |
| 2002/0021749 A1 | 2/2002 | Lee et al. | |
| 2002/0097811 A1 | 7/2002 | Kubo et al. | |
| 2003/0099365 A1 | 5/2003 | Karjalainen et al. | |
| 2004/0114270 A1 | 6/2004 | Chung et al. | |
| 2004/0151241 A1 | 8/2004 | Shimotoyodome | |

FOREIGN PATENT DOCUMENTS

| | | |
|---|---|---|
| JP | 57-138203 | 8/1982 |
| JP | 63-250957 | 10/1988 |
| JP | 06-061790 | 3/1994 |
| JP | 2004260807 | 9/2004 |

* cited by examiner

*Primary Examiner*—David H Malzahn
(74) *Attorney, Agent, or Firm*—Volentine & Whitt, P.L.L.C.

(57) ABSTRACT

A signal generator using an IIR type digital filter (recursive type digital filter) having multipliers A and B in a feedback loop. A control unit 2 provided for the signal generator sets and changes coefficients of the multipliers A and B and generates, supplies and stops an output signal while maintaining a frequency of the output signal. In each step of generating, supplying and stopping of the output signal, the frequency of the output signal can be maintained at a frequency upon stable output and the generation of harmonics can be minimized.

8 Claims, 9 Drawing Sheets

Fig.3

| | |
|---|---|
| Fo (OUTPUT FREQUENCY) | 400 |
| Fs (SAMPLING FREQUENCY) | 8000 |
| A1=2cos($\omega$T) | 1.902113033 |
| A2=1 | 1 |
| B0=sin($\omega$T) | 0.309016994 |

| SAMPLE NO. | y[n]=A1*y[n-1]-A2*y[n-2] | y[n-1] | y[n-2] |
|---|---|---|---|
| 0 | 0 | 0 | 0 |
| 1 | 0.309016994 | 0 | 0 |
| 2 | 0.587785252 | 0.309016994 | 0 |
| 3 | 0.809016994 | 0.587785252 | 0.309016994 |
| 4 | 0.951056516 | 0.809016994 | 0.587785252 |
| 5 | 1 | 0.951056516 | 0.809016994 |
| 6 | 0.951056516 | 1 | 0.951056516 |
| 7 | 0.809016994 | 0.951056516 | 1 |
| 8 | 0.587785252 | 0.809016994 | 0.951056516 |
| 9 | 0.309016994 | 0.587785252 | 0.809016994 |
| 10 | -1.88738E-15 | 0.309016994 | 0.587785252 |
| 11 | -0.309016994 | -1.88738E-15 | 0.309016994 |
| 12 | -0.587785252 | -0.309016994 | -1.88738E-15 |
| 13 | -0.809016994 | -0.587785252 | -0.309016994 |
| 14 | -0.951056516 | -0.809016994 | -0.587785252 |
| 15 | -1 | -0.951056516 | -0.809016994 |
| 16 | -0.951056516 | -1 | -0.951056516 |
| 17 | -0.809016994 | -0.951056516 | -1 |
| 18 | -0.587785252 | -0.809016994 | -0.951056516 |
| 19 | -0.309016994 | -0.587785252 | -0.809016994 |
| 20 | 2.88658E-15 | -0.309016994 | -0.587785252 |
| 21 | 0.309016994 | 2.88658E-15 | -0.309016994 |
| 22 | 0.587785252 | 0.309016994 | 2.88658E-15 |
| 23 | 0.809016994 | 0.587785252 | 0.309016994 |
| 24 | 0.951056516 | 0.809016994 | 0.587785252 |
| 25 | 1 | 0.951056516 | 0.809016994 |
| 26 | 0.951056516 | 1 | 0.951056516 |

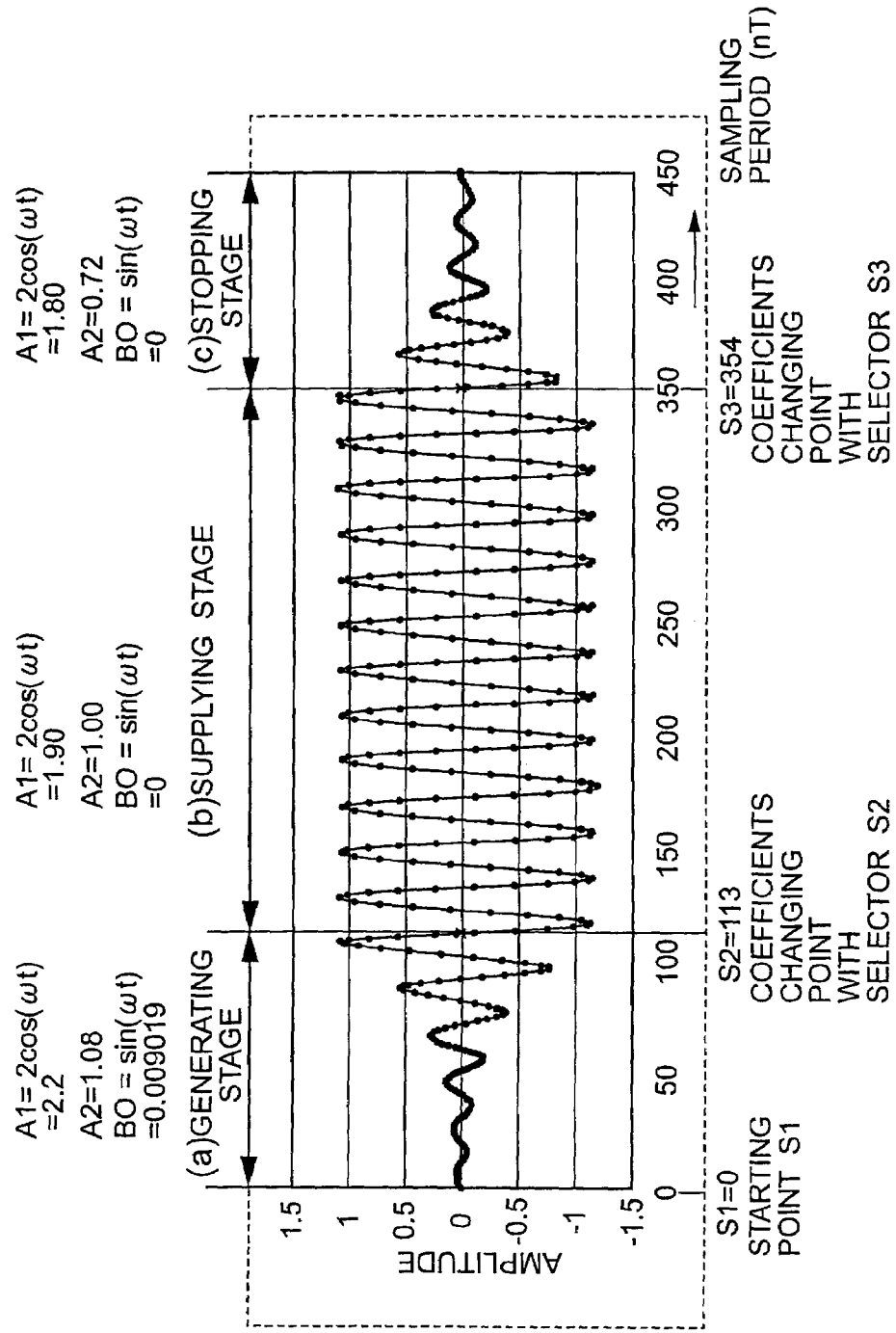

SIGNAL GENERATOR USING IIR TYPE DIGITAL FILTER; AND METHOD OF GENERATING, SUPPLYING, AND STOPPING ITS OUTPUT SIGNAL

BACKGROUND OF THE INVENTION

1. Field of the Invention

The invention relates to a signal generator using an IIR type digital filter, which is used as a re-generator of, for example, mobile communication system; and a method of generating, supplying, and stopping its output signal.

2. Related Background Art

According to a conventional signal generator using an IIR type digital filter, at the start of the operation, an impulse delta[n] (delta[n] are set to "all 0" except in the case where n=0) is inputted to the IIR type digital filter expressed by the following difference equation.

$$y[n]=x[n]+A1*y[n-1]-A2*y[n-2] \quad (1)$$

By transmitting output data y[n] to a multiplier (coefficient B0) provided out of a feedback loop of the IIR type digital filter, a desired output signal is obtained.

Poles of a transfer function of the equation (1) are set on a unit circle on a Z plane, not depending on each time when output signal is generated, supplied or stopped.

It is assumed hereinafter that generation of output signal denotes a stage (period of time) until the output signal becomes stable after signal generator started operating, that supply of output signal denotes a stage (period of time) after the output signal became stable, and that stop of output signal denotes a stage (period of time) until the output signal stops after it became stable. Moreover, the output signal denotes a signal obtained by converting the output data (digital signal) into an analog signal.

In the above prior art, if the signal generator is inputted with delta[n] at starting time of operation, for the signal generator to start operating; a value of the output data changes suddenly by transitional response which appears with generation of output signal. Moreover, if the output signal is stopped by switching the coefficient B0 of the multiplier to 0, a value of the output data changes suddenly by transitional response which appears with stop of output signal. Such a sudden change in output data is converted into an analog signal and its harmonics penetrate, as noises, peripheral circuits. Accordingly, a problem to be solved such that the noises sometimes cause inconvenience still remains.

In order to solve this problem, there is also a case where the coefficient B0 is gradually decreased to 0 and the output is stopped. In this case, a problem to be solved such that it is necessary to execute arithmetic operations of the coefficient B0 many times and a control method becomes complicated still remains. Accordingly, a technique for enabling a calculation or the like of the transfer function to be easily executed has also been released (for example, refer to a patent literature 1: JP-A-6-61790 (Abstract)).

What is to be solved by present invention is: a problem such that a value of the output data changes suddenly by transitional response which appears with generation of output signal, or by transitional response which appears with stop of output signal; and such a sudden change in output data is converted into an analog signal and its harmonics penetrate, as noises, peripheral circuits; causing inconvenience to peripheral circuits.

SUMMARY OF THE INVENTION

It is an object of the invention to solve the above problems and realize a signal generator using an IIR type digital filter in which an amount of noises which are generated is small and a control method of generating, supplying and stopping the output is simple.

To accomplish the above object, the invention has the following constructions.

An output generator; or an output generating, supplying and stopping method of a signal generator: using an IIR type digital filter having multipliers in a feedback loop.

In either of the generator or the method, the constructions are chiefly characterized by:

setting coefficients of said multipliers and generating output signal so that poles of a transfer function of said IIR type digital filter are kept setting to an outside of a unit circle on a Z plane, at generating stage of said output signal;

changing coefficients of said multipliers and supplying output signal so that poles of a transfer function of said IIR type digital filter are kept on an line of a unit circle on a Z plane so as to supply said output signal, at supplying stage of said output signal;

changing coefficients of said multipliers again and stopping output signal so that poles of a transfer function of said IIR type digital filter are set to an inside of a unit circle on a Z plane, at stopping stage of said output signal.

Further, in the poles of said transfer function, each ratio of a value on an imaginary axis to a value on a real axis of said poles, are set to an equal value, throughout generation, supply and stop of said output signal.

The above and other objects and features of the present invention will become apparent from the following detailed description and the appended claims with reference to the accompanying drawings.

BRIEF DESCRIPTION OF THE DRAWINGS

FIG. 3 is a table showing an example of execution numerical values of a difference equation;

FIG. 9 is an explanatory diagram of an output signal of the embodiment 2.

DETAILED DESCRIPTION OF THE PREFERRED EMBODIMENTS

Embodiment 1

An embodiment of the invention will be described hereinbelow.

As mentioned above, in the conventional signal generator using the IIR type digital filter, the output is generated, supplied and stopped without changing the coefficients of the multipliers provided in the feedback loop of the IIR type digital filter. In the embodiment, the output is generated, supplied and stopped by changing a coefficient of a multiplier provided in the feedback loop. By this method, poles of a transfer function can be moved in accordance with a predetermined principle. Thus, in each step of an output generating, supplying and stopping, the output signal can be stopped while a frequency of the output signal is maintained at a frequency of the output signal at the time of the stable output, and the generation of harmonics can be minimized. To accomplish the above object, a signal generator using an IIR type digital filter according to the embodiment 1 is constructed as follows.

Figure 1:
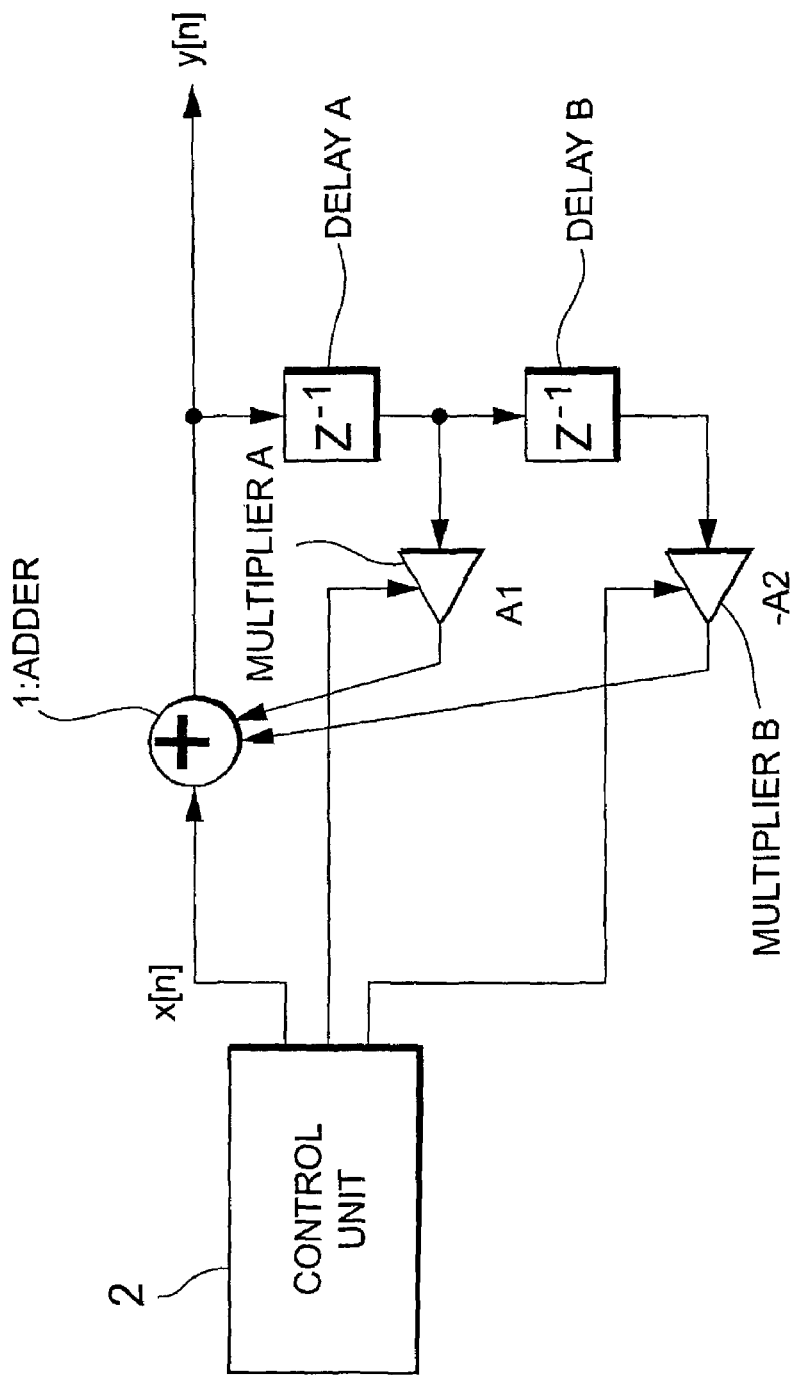
FIG. 1 is a block diagram showing a construction of an embodiment 1.

FIG. 1 is a block diagram showing a construction of the embodiment 1.

As shown in the diagram, the signal generator using the IIR type digital filter according to the embodiment 1 comprises an adder 1, a control unit 2, a delay A, a delay B, a multiplier A, and a multiplier B.

The adder 1 is a portion for adding data of a plurality of digital data series and outputting resultant addition data. That is, at a point of time when the operation of the signal generator is started, data of an input data series x[n], data of a feedback data series y[n-1] passing through the delay A and multiplier A, and data of a feedback data series y[n-2] passing through the delay B and multiplier B are added and resultant addition data is outputted. After the start of the operation, the data of the feedback data series y[n-1] passing through the delay A and multiplier A and the data of the feedback data series y[n-2] passing through the delay B and multiplier B are added and resultant addition data is outputted.

The reason why the data series which are added at the start of the operation and the data series which are added after the start of the operation are different is because since the target of the invention is an oscillator, the data of the input data series x[n] has a predetermined value only when the operation is started (n=0) and the data is equal to x[n]=0 at other points of time. It is now assumed that x[0]=B0 and at other time points n<0; and; 1<n, or, 1=n; x[n]=0. The data series x[0]= B0 may be supplied from control unit 2, or from an outer apparatus not shown in the drawings.

The control unit 2 is a portion for changing coefficients of the multipliers A and B while the signal generator using the IIR type digital filter is outputting a desired signal. That is, the control unit 2 is a portion for generating, supplying and stopping the output of the signal generator by changing the coefficients of the multipliers A and B to predetermined values during the operation of the signal generator. Usually, in many cases, the control unit 2 is constructed as a part of a function of a CPU or a DSP constructing the signal generator using the IIR type digital filter.

The delay A is a delay element for delaying the data of the output data series by a one-sampling period of time. In this case, the delay A is a delay element for delaying the data of the output data series y[n] by a one-sampling period of time and outputting it as y[n-1].

In the case where the delay element for delaying the data by a one-sampling period of time is Z-transformed and displayed, it is expressed as $Z^{-1}$.

The delay B is a delay element for further delaying the output data of the delay A by a one-sampling period of time. In this case, the delay B delays the data of the output data series y[n] by a two-sampling period of time and outputs it as y[n-2]. In the case where the delay element for delaying the data by a two-sampling period of time is Z-transformed and displayed, it is expressed as $Z^{-2}$.

The multiplier A is a portion for multiplying the input data by a predetermined value. In this instance, the multiplier A is a portion for multiplying the output data y[n-1] of the delay A by a constant A1, outputting it as A1*y[n-1], and transferring it to the adder 1. In the invention, the constant A1 is set by the control unit 2 on a stage where the output signal is generated, and changed on stages where the output signal is supplied and stopped.

The multiplier B is a portion for multiplying the input data by a predetermined value. In this instance, the multiplier B is a portion for multiplying the output data y[n-2] of the delay B by a constant -A2, outputting it as -A2*y[n-2], and transferring it to the adder 1. In the invention, the constant A2 is set by the control unit 2 on a stage where the output signal is generated, and changed on stages where the output signal is supplied and stopped.

A relation between the input data and the output data of the signal generator using the IIR type digital filter according to the embodiment 1 is expressed by the following difference equation (1) from the above component portions.

$$y[n]=x[n]+A1*y[n-1]-A2*y[n-2] \quad (1)$$

where, y[n]: the output data series of the signal generator using the IIR type digital filter in the embodiment 1. Usually, the output data series is converted into an analog sine wave signal after that, by an analog filter not shown in the drawings.

As for x[n], since the target of the invention is the oscillator as mentioned above, x[0]=B0 only at the start of the operation (n=0). It is assumed that at other time points of n<0; and, 1<n or 1=n; x[n]=0.

It is a well-known fact that in the case where the signal generator using the IIR type digital filter is used as a sine wave oscillator, B0 is set to B0=sin(wT).

Where, w: angular frequency of a frequency $F_o$ of the output signal,

T: one period ($1/F_s$) of a sampling frequency $F_s$.

B0 can be given from the outside at the start of the operation of the signal generator using the IIR type digital filter or the last output data stored at the end of the previous operation of the signal generator using the IIR type digital filter can be used.

Similarly, it is also a well-known fact that in the case where the signal generator using the IIR type digital filter is used as a sine wave oscillator, A2 is set to A2=1 and A1 is set to A1=2 cos(wT).

Where, w: angular frequency of the output frequency $F_o$, T: one period ($1/F_s$) of the sampling frequency $F_s$.

Subsequently, stability of the signal generator using the IIR type digital filter in the embodiment 1 will be explained.

By Z-transforming the equation (1) and arranging it, the following transfer function H(Z) is obtained.

$$Y(Z) = B0^* X(Z)/(1 - A1^* Z^{-1} + A1^* Z^{-2}) \quad (2)$$

$$H(Z) = Y(Z)/X(Z)$$
$$= B0^* Z^2 / (Z^2 - A1^* Z + A2)$$

A pole $Z_p$ is obtained from the above equation (2).

$$Z_p = \{A1 - (A1^2 - 4^* A2)^{1/2}\}/2 \quad (3)$$

Since A2 is fixed to 1 as mentioned above, the following equation is obtained.

$$Z_p = \{A1 - (A1^2 - 4)^{1/2}\}/2 \quad (4)$$

The equation (4) is expressed on a Z plane as follows.

Figure 2:
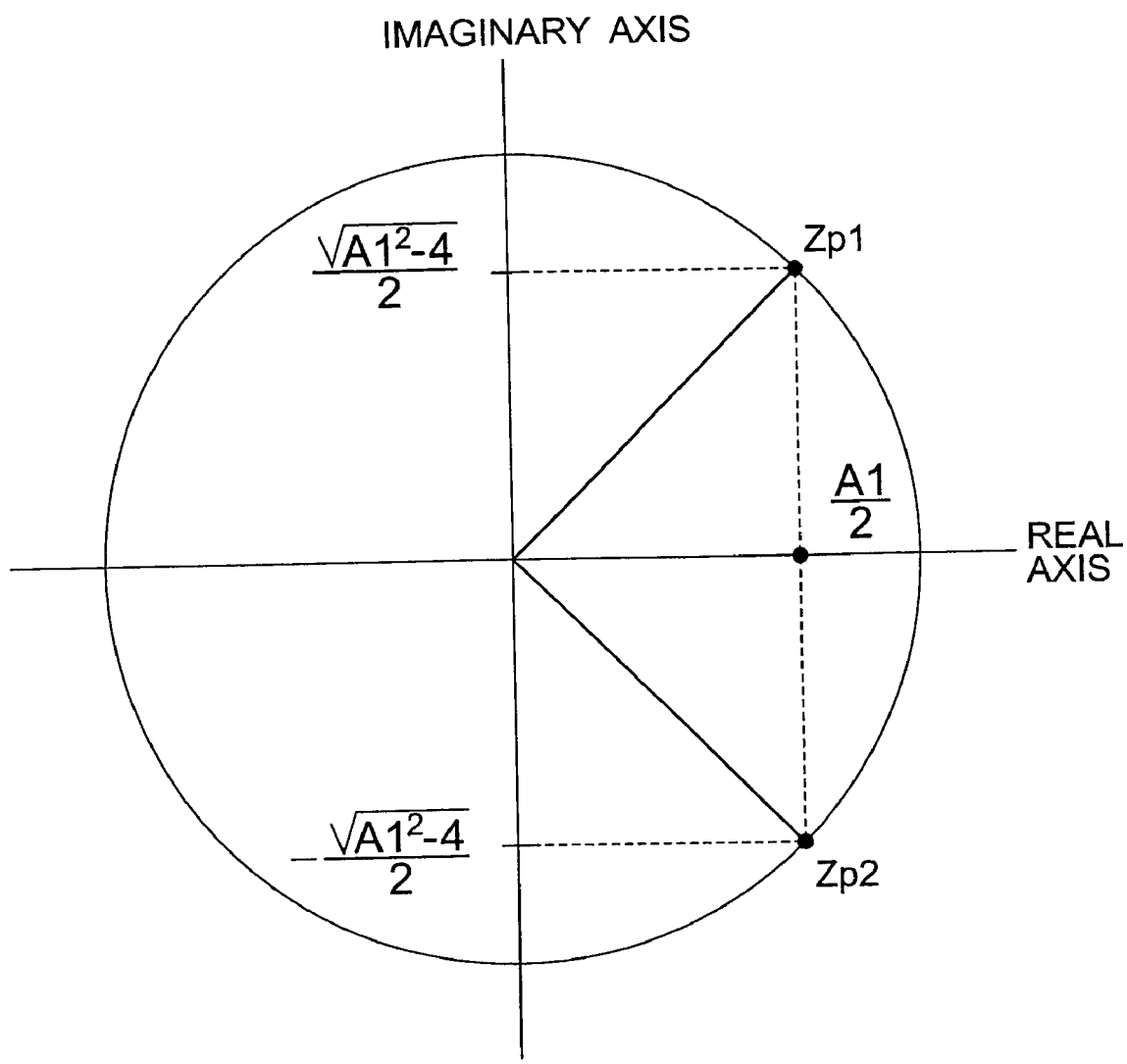
FIG. 2 is a diagram showing poles of a transfer function.

FIG. 2 is a diagram showing the poles of the transfer function.

As shown in the diagram, the equation (4) is expressed as two poles of $Z_{p1}$ and $Z_{p2}$ onto the Z plane.

An example of the operation in the case where the signal generator using the IIR type digital filter in the embodiment 1 supplies an output signal on the basis of the above results will be analyzed by specifically setting numerical values.

When the difference equation (1) is solved, it is as follows on the basis of the above results.

FIG. 3 is a table showing an example of execution numerical values of the difference equation.

Figure 4:
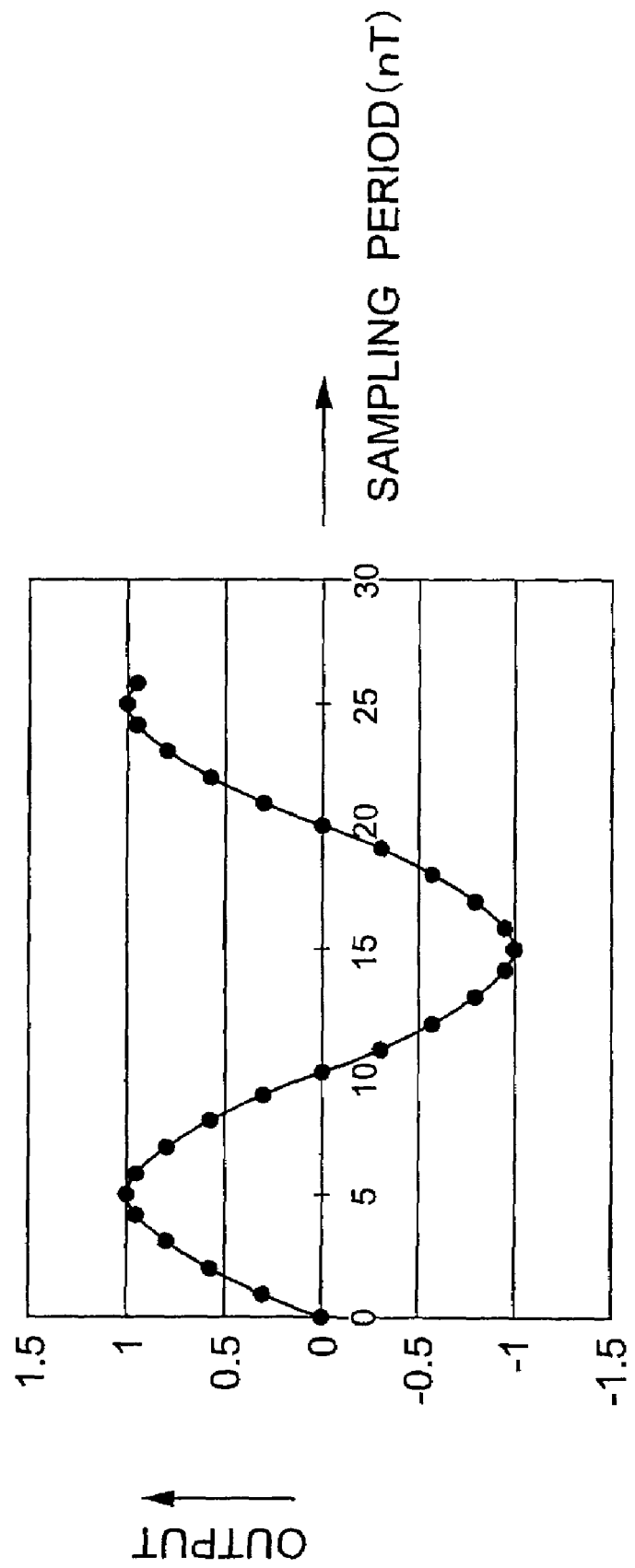
FIG. 4 is a diagram showing an example of an execution wave form of the difference equation.

FIG. 4 is a diagram showing an example of an execution wave form of the difference equation.

FIG. 3 shows calculation results of the output data series y[n], the output data series y[n-1] of the multiplier A, and the output data series y[n-2] of the multiplier B in the case where the frequency $F_o$ of the output signal is set to 400 Hz, the sampling frequency $F_s$ is set to 8000 Hz, A1=2 cos(wT), A2=1, and B0=sin(wT) in the difference equation (1) as the embodiment 1.

FIG. 4 shows a graph of the output data series y[n] in FIG. 3.

In the diagram, an axis of ordinate indicates an output level standardized by an amplitude 1 and an axis of abscissa indicates a time converted into a sampling period.

As shown in FIG. 4, it will be understood that the signal generator using the IIR type digital filter in the embodiment 1 generates the sine wave signal whose amplitude is equal to 1 and whose cycle period is equal to 20T, in a stage of supplying output signal (at time of stable output).

In this case, a value of the pole of the transfer function is as follows from the equation (4).

$$Z_p = \{A1 - (A1^2 - 4)^{1/2}\}/2 \quad (5)$$
$$= 0.951056516 + -0.309016993i$$

Moreover, when u is defined by a ratio of a value on an imaginary axis to a value on a real axis, it is as follows.

$$u = 0.309016993/0.951056516 \quad (6)$$

The equations (5) and (6) are expressed on the Z plane as follows.

Figure 5:
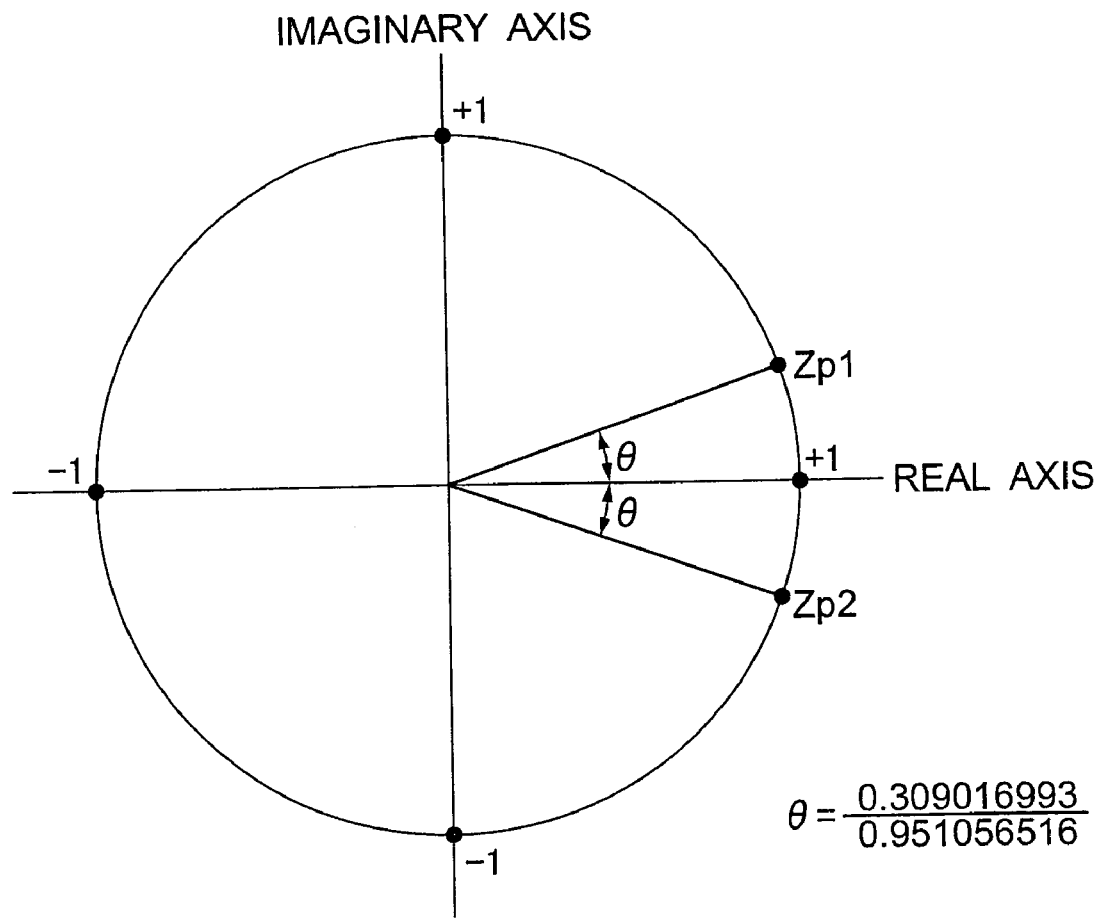
FIG. 5 is a diagram showing a calculation result of the poles.

FIG. 5 is a diagram showing a calculation result of the poles.

As shown in FIG. 5, the equation (5) is shown on a unit circle of the Z plane as conjugate complex roots $Z_{p1}$ and $Z_{p2}$.

That is, it will be understood that the signal generator using the IIR type digital filter in the embodiment 1 stably supplies the desired signal.

Subsequently, an example of operation on generating stage and stopping stage of output signal of the signal generator using the IIR type digital filter in the embodiment 1 will be described.

In the embodiment 1, the control unit 2 (FIG. 1) changes the coefficients A1, A2 in equation (1). And, on generating stage of output signal, poles of transfer function of the IIR type digital filter are kept remained outside of unit circle on Z plane. On supplying stage of output signal, the poles are kept remained on line of unit circle on Z plane. On stopping stage of output signal, the poles are kept remained inside of unit circle on Z plane. Further, each ratio u of the value on the imaginary axis to the value on the real axis, of the poles of transfer function, are kept equal throughout the generating stage, supplying stage and stopping stage of output signal.

At first, an operation of the control unit 2 (FIG. 1) changing the coefficients A1, A2, so as to set poles of transfer function and to move them, will be described.

Figure 6:
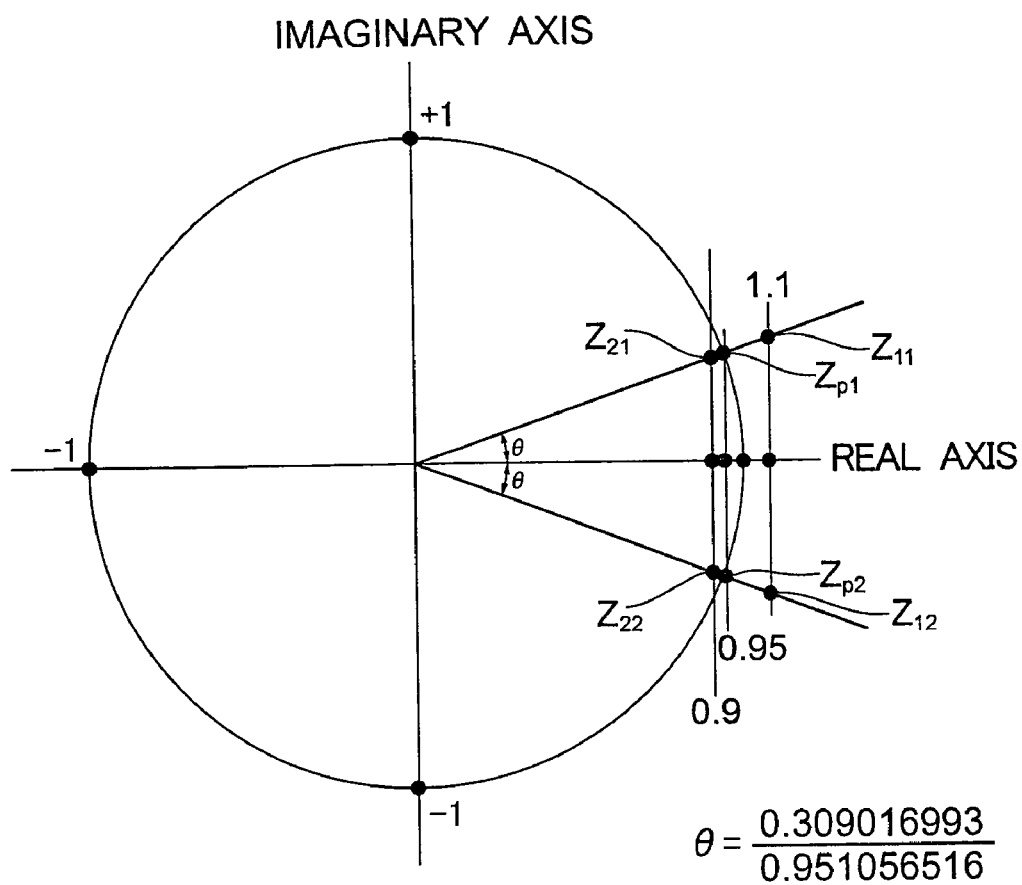
FIG. 6 is an explanatory diagram of a movement result of the poles.

FIG. 6 is an explanatory diagram of a movement result of the poles.

As shown in FIG. 6, located on Z plane, are the conjugate complex roots $Z_{p1}$ and $Zp_2$ (value on real axis is 0.951056516 (equation (5))), the conjugate complex roots $Z_{11}$ and $Z_{12}$ (value on real axis is 1.1 (an example)), and the conjugate complex roots $Z_{21}$ and $Z_{22}$ (value on real axis is 0.9 (an example)). Here, $Z_{p1}$, $Z_{11}$, and $Z_{21}$ are located on line rotated by u from real axis counter-clockwise. And, $Z_{p2}$, $Z_{12}$, and $Z_{22}$ are located on line rotated by u from real axis clockwise. Here, u is as follows, u=0.309016993/0.951056516, which is obtained from equation (6).

When the signal generator starts operating, the control unit 2 (FIG. 1) changes the coefficients A1, A2 in equation (1) so as to set the poles of transfer function to the conjugate complex roots $Z_{11}$, $Z_{12}$. As shown in FIG. 6, the conjugate complex roots $Z_{11}$, $Z_{12}$ are respectively on the lines of +u or -u. And, the values of real parts are set to 1.1 respectively. Therefore, from equation (5) and equation (3), what is obtained is as follows, $Z_{11}$, $Z_{12}$=1.1+0.3574098i or 1.1-0.3574098i; A1=2.2, A2=1.08. In this occasion, the conjugate complex roots $z_{11}$ and $z_{12}$ are located outside of unit circle. Therefore, the amplitude of output signal gradually increases.

When amplitude of the output signal increases to become a desired value, the control unit 2 (FIG. 1) changes the coefficients A1, A2 in equation (1) so as to change the poles of transfer function to the conjugate complex roots $Z_{p1}$, $Z_{p2}$. As shown in FIG. 6, the conjugate complex roots $z_{p1}$, $Z_{p2}$ are respectively on the lines of +u or -u. And, they are set on line of the unit circle. Therefore, from equation (5) and equation (3), what is obtained is as follows, $Z_{p1}$, $Z_{p2}$=0.95+0.309016993i or 0.95-0.309016993i; A1=1.09, A2=1. In this occasion, the conjugate complex roots $z_{p1}$ and $z_{p2}$ are on line of unit circle. Therefore, the output signal is in a stable state. This state is already explained with referring to FIG. 3 and FIG. 4.

After a prescribed time passed while the output signal is in a stable state, the control unit 2 (FIG. 1) changes the coefficients A1, A2 in equation (1) so as to change the poles of transfer function to the conjugate complex roots $Z_{21}$, $Z_{22}$. As shown in FIG. 6, the conjugate complex roots $Z_{21}$, $Z_{22}$ are respectively on the lines of +u or -u. And, the values of real parts are set to 0.9 respectively. Therefore, from equation (3) and equation (5), what is obtained is as follows, $Z_{21}$, $Z_{22}$=0.9+0.292426 or 0.9-0.292426; A1=1.80, A2=0.72. In this occasion, the conjugate complex roots $Z_{21}$ and $Z_{22}$ are located inside of unit circle. Therefore, amplitude of output signal gradually attenuates. And, the signal generator comes to stop.

Figure 7:
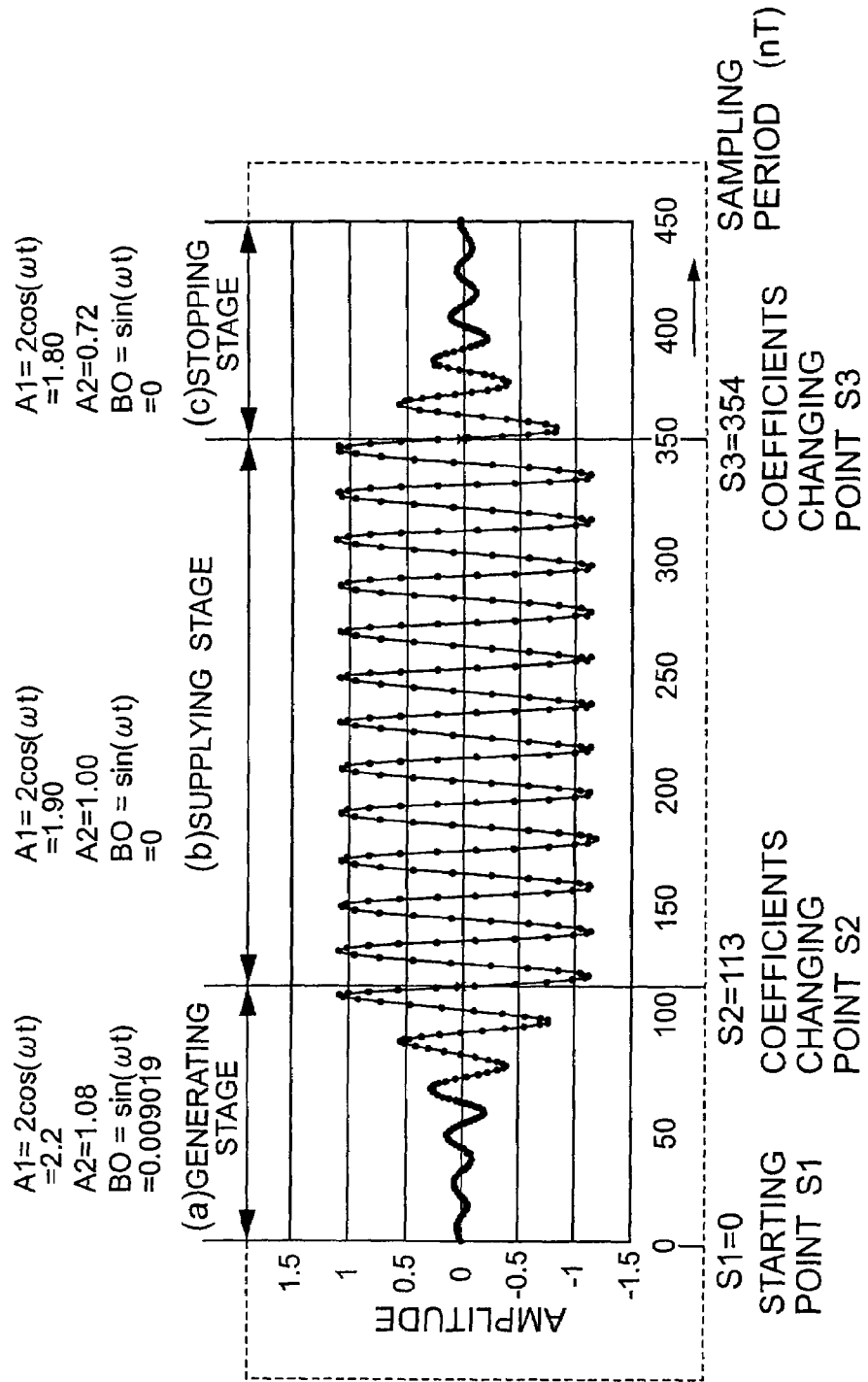
FIG. 7 is an explanatory diagram of an output signal of the embodiment 1.

FIG. 7 is an explanatory diagram of the output signal of the embodiment 1.

In the diagram, an axis of ordinate indicates the output level and an axis of abscissa indicates the time converted into the sampling period.

In FIG. 7, what is shown is amplitude of output signal varying according as time passes, depending on movement of poles, described with referring to FIG. 6.

At a starting time S1 of operation, the signal generator with IIR digital filter of the embodiment 1 starts operating, so as to enter a generating stage (a). In this occasion, the control unit 2 (FIG. 1) sets the coefficient of the multiplier A to a preset value A1=2.2. And, it sets the coefficient of the multiplier B to a preset value A2=1.08. By this setting, the poles of transfer function are set to the conjugate complex roots $z_{11}$ and $z_{12}$ in FIG. 6. At the same time, the adder 1 accepts B0=0.009019 from X[n] as an initial value. In this occasion, the conjugate complex roots $z_{11}$ and $Z_{12}$ are positioned outside of unit circle. Therefore, the amplitude of output signal gradually increases. The values of B0 and conjugate complex roots $z_{11}$ and $Z_{12}$ are set properly from either of time intervals allowed in the generating stage (a). The object of present invention is achieved with setting values mentioned above, when time intervals allowed are about 100 sampling period.

At a time S2 (actual measured value is in the vicinity of 113 sampling periods) of changing coefficients, the control unit 2 (FIG. 1) changes the coefficient of the multiplier A to a preset value A1=1.90. And, it changes the coefficient of the multiplier B to a preset value A2=1.0. By this change, the poles of transfer function are changed to the conjugate complex roots $z_{p1}$ and $z_{p2}$ in FIG. 6, so as to enter a supplying stage (b). Then, on this stage, an output signal which frequency F0 is 400 Hz and which sampling frequency FS is 8000 Hz, is stably supplied until a desired time S3 (actual measured value is in the vicinity of 354 sampling periods). In this occasion, the conjugate complex roots $z_{p1}$ and $z_{p2}$ are on line of unit circle (FIG. 6).

At a time S3 (actual measured value is in the vicinity of 354 sampling periods) of changing coefficients, the control unit 2 (FIG. 1) changes the coefficient of the multiplier A to a preset value A1=1.80.

And, it changes the coefficient of the multiplier B to a preset value A2=0.72. By this change, the poles of transfer function are changed to the conjugate complex roots $z_{21}$ and $z_{22}$ in FIG. 6, so as to enter a stopping stage (c). In this occasion, the conjugate complex roots $z_{21}$ and $z_{22}$ are positioned inside of unit circle (FIG. 6). Therefore, amplitude of output signal gradually attenuates. And, the signal generator comes to stop. The values of conjugate complex roots $z_{21}$ and $z_{22}$ are set properly from either of time intervals allowed in the stopping stage (c). The object of present invention is achieved with setting values mentioned above, when time intervals allowed are about 100 sampling period.

In operation on the generating stage and stopping stage of the signal generator with IIR digital filter of the embodiment 1 described above, following principles are applied to the movement of the poles.

Principle 1

The conjugate complex roots $z_{11}$ and $z_{12}$ on the generating stage (a) are located outside of the unit circle on the Z plane.

This principle is indispensable to shift the mode of the signal generator using the IIR type digital filter in the embodiment 1 from a stopping state to a supplying state, with restraining times of changing coefficients to minimum.

Principle 2

The conjugate complex roots $z_{21}$ and $z_{22}$ on the stopping stage (c) are moved to inside of the unit circle on Z plane.

This principle is indispensable to shift the mode of the signal generator using the IIR type digital filter in the embodiment 1 from a supplying state to a stopping state, with restraining times of changing coefficients to minimum.

Principle 3

The poles on the Z plane is moved, in a manner such that a ratio of a value on an imaginary axis to a value on a real axis of the pole on the Z plane before the coefficients are changed is equal to that after the change of the coefficients.

This principle is necessary to minimize the generation of harmonics while maintaining the same frequency in the step of shifting the mode of the signal generator using the IIR type digital filter in the embodiment 1 from the stopping state to the supplying state, and from the supplying state to the stopping state.

In the above description, nothing is mentioned in particular with respect to whether each component portion is constructed by software or constructed by hardware. That is, each component portion can be constructed by software or individually constructed by hardware.

According to the embodiment 1, by changing the coefficient of the multiplier in the feedback loop as described above, the poles of the transfer function can be set and moved in accordance with the predetermined principle. Thus, an effect such that even in the generating and stopping steps of output signal, the frequency of the output signal can be maintained at the frequency upon stable output, so that the generation of the harmonics can be minimized is obtained.

Embodiment 2

In the embodiment 2, selectors are provided in place of the control unit 2 (FIG. 1) in the embodiment 1. The selector selects a predetermined one of a plurality of coefficients which have previously been calculated as coefficients of the multipliers and changes the coefficients of the multipliers in a feedback loop, thereby generating, supplying and stopping output signal of a signal generator using an IIR type digital filter according to the embodiment 2. To accomplish the above object, the signal generator using the IIR type digital filter of the embodiment 2 is constructed as follows.

Figure 8:
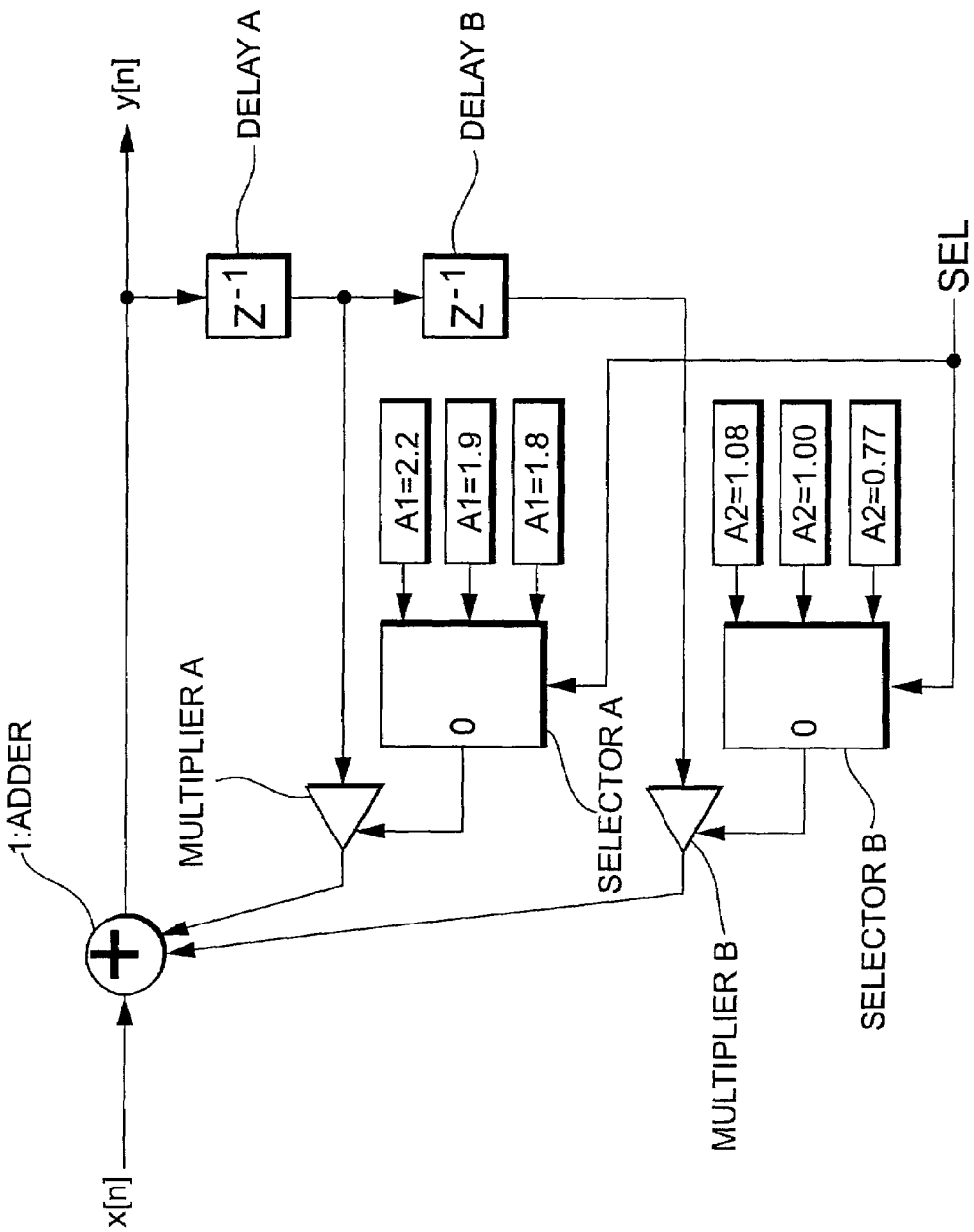
FIG. 8 is a block diagram showing a construction of an embodiment 2.

FIG. 8 is a block diagram of a construction of the embodiment 2.

As shown in the diagram, the signal generator using the IIR type digital filter of the embodiment 2 comprises the adder 1, the delay A, the delay B, the multiplier A, the multiplier B, a selector A, and a selector B.

Only points different from the embodiment 1 will be described.

The selector A is a portion for selecting a predetermined one of a plurality of set values which have been preset as a coefficient of the multiplier A and enabling the coefficient of the multiplier A to be changed.

The selector B is a portion for selecting a predetermined one of a plurality of set values which have been preset as a coefficient of the multiplier B and enabling the coefficient of the multiplier B to be changed.

Since all other component portions are similar to those in the embodiment 1, their description is omitted here.

FIG. 9 is an explanatory diagram of an output signal of the embodiment 2.

FIG. 9 shows a state where the signal generator using the IIR type digital filter in the embodiment 2 enters the generating, supplying and stopping states of output signal.

In the diagram, an axis of ordinate indicates the output level and an axis of abscissa indicates the time converted into the sampling period.

At a starting time s1 of operation, the signal generator of the embodiment 2 starts operating, so as to enter a generating stage (a). The selector A (FIG. 8) accepts a selection signal SEL from outside of the signal generator. And, it sets the coefficient of the multiplier A (FIG. 8) to a preset value A1=2.2. On the other hand, the selector B (FIG. 8) accepts the same selection signal SEL from outside of the signal generator. And, it sets the coefficient of the multiplier B (FIG. 8) to a preset value A2=1.08.

By this selection, the poles of transfer function are set to the conjugate complex roots $z_{11}$ and $z_{12}$ in FIG. 6. At the same time, the adder 1 accepts B0=0.009019 from X[n] as an initial value. In this occasion, the conjugate complex roots $z_{11}$ and $z_{12}$ are set outside of unit circle. Therefore, the amplitude of output signal gradually increases. The values of B0 and conjugate complex roots $z_{11}$ and $z_{12}$ are set properly from either of time intervals allowed in the generating stage (a). The object of present invention is achieved with setting values mentioned above, when time intervals allowed are about 100 sampling period.

At a time s2 (actual measured value is in the vicinity of 113 sampling periods) of changing coefficients by selector, the selector A accepts a selection signal SEL from outside of the signal generator. And, it sets the coefficient of the multiplier A to a preset value A1=1.90. On the other hand, the selector B accepts the same selection signal SEL from outside of the signal generator. And, it sets the coefficient of the multiplier B to a preset value A2=1.0.

By this selection, the poles of transfer function are changed to the conjugate complex roots $z_{p1}$ and $z_{p2}$ in FIG. 6, so as to enter a supplying stage (b). Then, on this stage, an output signal which frequency F0 is 400 Hz and which sampling frequency FS is 8000 Hz, is stably supplied until a desired time s3 (actual measured value is in the vicinity of 354 sampling periods).

In this occasion, the conjugate complex roots $z_{p1}$ and $z_{p2}$ are set on line of unit circle (FIG. 6).

At a time s3 (actual measured value is in the vicinity of 354 sampling periods) of changing coefficients by selector, the selector A accepts a selection signal SEL from outside of the signal generator.

And, it sets the coefficient of the multiplier A to a preset value A1=1.80. On the other hand, the selector B accepts the same selection signal SEL from outside of the signal generator. And, it sets the coefficient of the multiplier B to a preset value A2=0.72.

By this selection, the poles of transfer function are changed to the conjugate complex roots $z_{21}$ and $z_{22}$ in FIG. 6, so as to enter a stopping stage (c). In this occasion, the conjugate complex roots $z_{21}$ and $z_{22}$ are set inside of unit circle (FIG. 6). Therefore, amplitude of output signal gradually attenuates. And, the signal generator comes to stop. The values of conjugate complex roots $z_{21}$ and $z_{22}$ are set properly from either of time intervals allowed in the stopping stage (c). The object of present invention is achieved with setting values mentioned above, when time intervals allowed are about 100 sampling period.

Since the selector for selecting a predetermined one of the plurality of coefficients which have previously been calculated as coefficients of the multipliers, changing the coefficients of the multipliers in the feedback loop, and generating, supplying and stopping the output signal is provided; an effect such that the generation of the harmonics is minimized and the output signal can be generated, supplied and stopped by the simple hardware construction, is obtained.

The present invention is not limited to the foregoing embodiments but many modifications and variations are possible within the spirit and scope of the appended claims of the invention.

What is claimed is:

1. A signal generator using an IIR type digital filter having multipliers in a feedback loop, wherein
   said signal generator includes a control unit which changes coefficients of said multipliers, and
   said control unit sets said coefficients to predetermined values so that said signal generator generates an output signal, and said control unit changes said coefficients while maintaining a frequency of said output signal, so that said output signal is supplied stably.

2. A signal generator using an IIR type digital filter having multipliers in a feedback loop, wherein
   said signal generator includes a control unit which changes coefficients of said multipliers, and
   said control unit sets said coefficients to predetermined values so that said signal generator generates an output signal, and said control unit changes said coefficients while maintaining a frequency of said output signal, so that said output signal is supplied and to stop said output signal,
   wherein in said predetermined value
   poles of a transfer function of said IIR type digital filter are set to an outside of a unit circle on a Z plane so as to generate said output signal,
   the poles of the transfer function of said IIR type digital filter are set to a line of the unit circle on the Z plane so as to supply said output signal, and
   the poles of the transfer function of said IIR type digital filter are re-set to an inside of the unit circle on the Z plane so as to stop said output signal.

3. The generator according to 2, wherein
   in the poles of said transfer function,
   each ratio of a value on an imaginary axis to a value on a real axis of said poles are set to an equal value throughout generation, supply and stopping of said output signal.

4. A signal generator using an IIR type digital filter having multipliers in a feedback loop, wherein
   said signal generator includes a selector to select a predetermined one of a plurality of set values which have been preset as coefficients of said multipliers, and to change said predetermined one of set values, and
   said predetermined value is selected so that said signal generator generates an output signal, and said predetermined value is changed by said selector while maintaining a frequency of said output signal so that output of said output signal is supplied stably.

5. A signal generator using an IIR type digital filter having multipliers in a feedback loop, wherein
   said signal generator includes a selector to select a predetermined one of a plurality of set values which have been preset as coefficients of said multipliers, and to change said predetermined one of set values, and
   said predetermined value is selected so that said signal generator generates an output signal, and said predetermined value is changed by said selector while maintaining a frequency of said output signal so that output of said output signal is supplied stably and stopped, wherein in said predetermined value poles of a transfer function of said IIR type digital filter are set to an outside of a unit circle on a Z plane so as to generate said output signal, the poles of the transfer function of said IIR type digital filter are set on a line of the unit circle on the Z plane so as to supply said output signal, and the poles of the transfer function of said IIR type digital filter are re-set to an inside of the unit circle on the Z plane so as to stop said output signal.

6. The generator according to claim 5, wherein in the poles of said transfer function, each ratio of a value on an imaginary axis to a value on a real axis of said poles are set to an equal value throughout generation, supply and stopping of said output signal.

7. An output generating, supplying and stopping method of a signal generator using an IIR type digital filter having multipliers in a feedback loop, comprising:

setting coefficients of said multipliers and generating an output signal so that poles of a transfer function of said IIR type digital filter are kept set to an outside of a unit circle on a Z plane, changing coefficients of said multipliers and supplying the output signal so that the poles of the transfer function of said IIR type digital filter are kept on a line of the unit circle on the Z plane so as to supply said output signal, and changing coefficients of said multipliers again and stopping the output signal so that the poles of the transfer function of said IIR type digital filter are set to an inside of the unit circle on the Z plane.

8. The method according to claim 7, wherein upon movement of the poles of said transfer function, the poles are moved while each ratio of a value on a imaginary axis to a value on a real axis of the poles are set to an equal value throughout generation, supply and stopping of the output signal.

* * * * *